United States Patent [19]

Young et al.

[11] Patent Number: 4,859,953

[45] Date of Patent: Aug. 22, 1989

[54] MODULAR TEST ASSEMBLY FOR WIRING HARNESSES

[75] Inventors: Douglas A. Young, Cortland; Jay F. Gilson, Warren, both of Ohio

[73] Assignee: General Motors Corporation, Detroit, Mich.

[21] Appl. No.: 216,904

[22] Filed: Jul. 8, 1988

[51] Int. Cl.$^4$ ............................................. G01R 31/02
[52] U.S. Cl. ..................................... 324/539; 324/66; 361/428
[58] Field of Search ............... 324/66, 73 R, 538–540, 324/158 F; 29/593, 705, 749, 755; 140/92.1, 93; 361/331–333, 346, 428

[56] References Cited

U.S. PATENT DOCUMENTS

| | | | |
|---|---|---|---|
| 2,962,659 | 11/1960 | Neill | 324/66 |
| 3,246,240 | 4/1966 | Arnold et al. | 324/73 |
| 3,250,992 | 5/1966 | Cronkite et al. | 324/66 |
| 3,407,480 | 10/1968 | Hill et al. | 29/593 |
| 3,521,161 | 7/1970 | Kurata et al. | 324/66 |
| 3,633,096 | 1/1972 | Bollman | 324/538 |
| 3,653,411 | 4/1972 | Mosher et al. | 29/755 X |
| 3,705,347 | 12/1972 | Tuller | 324/66 |
| 3,752,198 | 8/1973 | Fiorentino et al. | 29/755 X |
| 3,867,692 | 2/1975 | Esch | 324/66 |
| 3,931,574 | 1/1976 | Curtis, Jr. et al. | 324/158 F |
| 3,946,768 | 3/1976 | Fiorentino | 140/92.1 |
| 4,030,029 | 6/1977 | Cox | 324/66 |
| 4,090,537 | 5/1978 | Bollman | 140/92.1 |
| 4,183,091 | 1/1980 | Murai | 324/538 X |
| 4,483,373 | 11/1984 | Tarbox | 140/92.1 |
| 4,689,551 | 8/1987 | Ryan et al. | 324/51 |
| 4,711,025 | 12/1987 | DeSanto | 29/755 X |

OTHER PUBLICATIONS

"Cable Forming Method" by IBM-Technical Disclosure vol. 13, No. 12, May 1971.

Primary Examiner—Reinhard J. Eisenzopf
Assistant Examiner—Jack B. Harvey
Attorney, Agent, or Firm—F. J. Fodale

[57] ABSTRACT

A test assembly for testing a preassembled wiring harness for location of mounting brackets at spaced points on the harness assembly and for evaluating terminals of the wiring harness includes a faceplate with a plurality of slots formed across the full planar extent thereof to accommodate a variety of different holder and detecting device layouts corresponding to a variety of types of wiring harness configurations. A separate faceplate is supported on each of a plurality of modular units joined together to accept different length wiring harness configurations. Standard length cables are connected to each of the holders and detecting devices. The cables have a connector wired thereto which fits through the slots to provide access from the faceplate to the interface cards without splicing into the wiring system. The modular frame units include a standardized mounting arrangement for interface boards or cards that include circuit components for simulating different modes of wiring harness use to be evaluated by a wiring harness tester control. The modular frame system includes a support platform thereon configured to releasably secure the harness tester in a fixed location with respect to the interface board components.

9 Claims, 6 Drawing Sheets

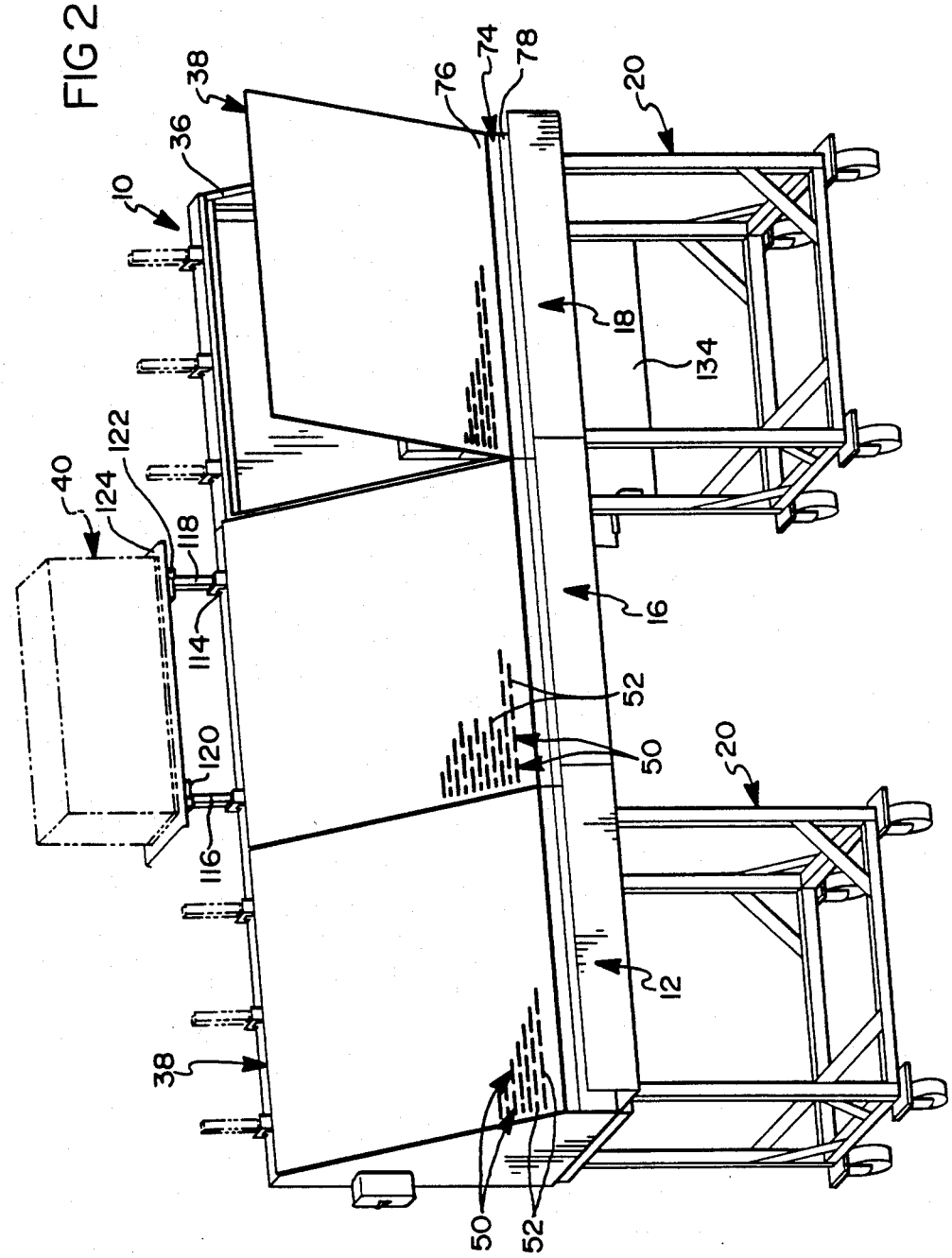

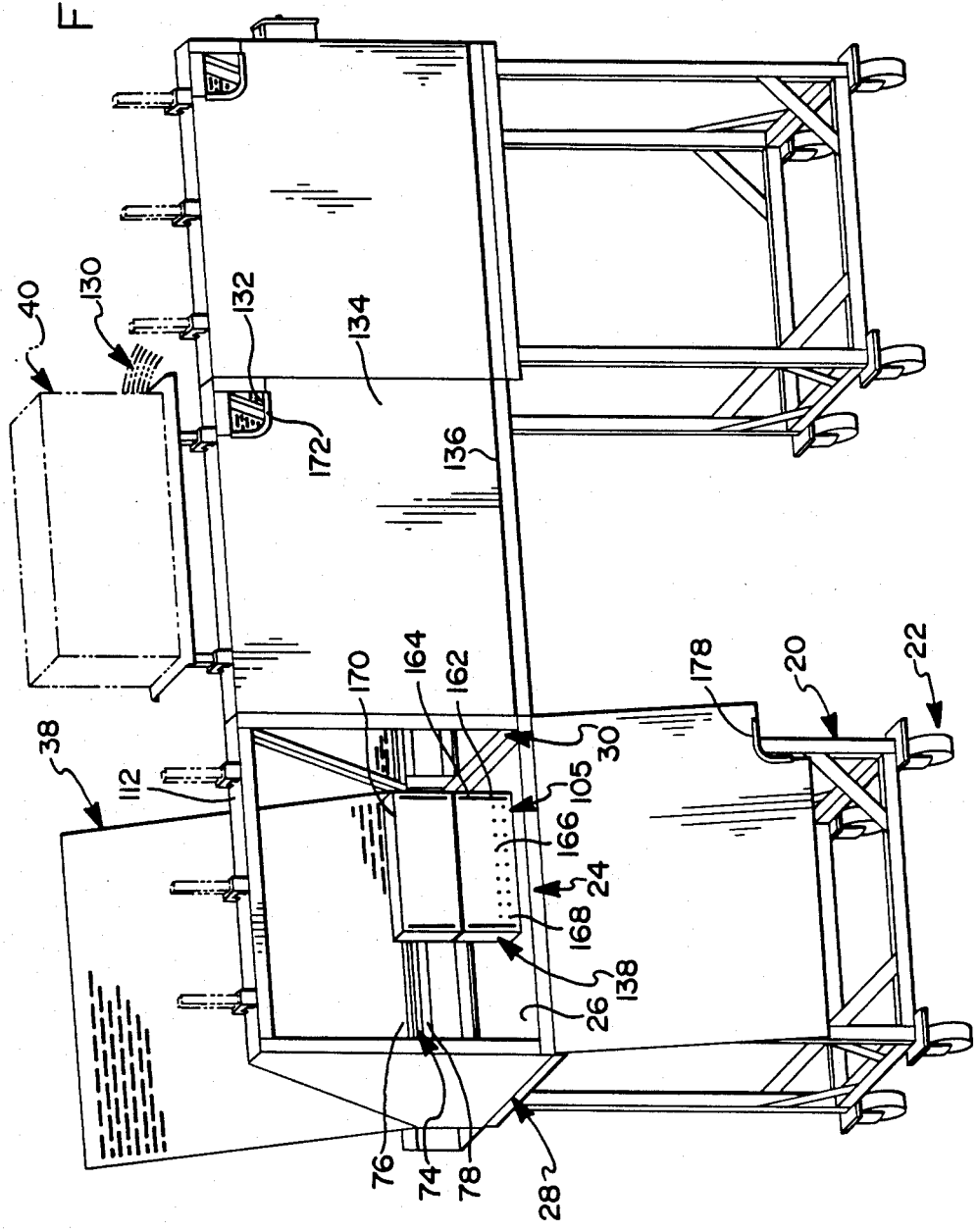

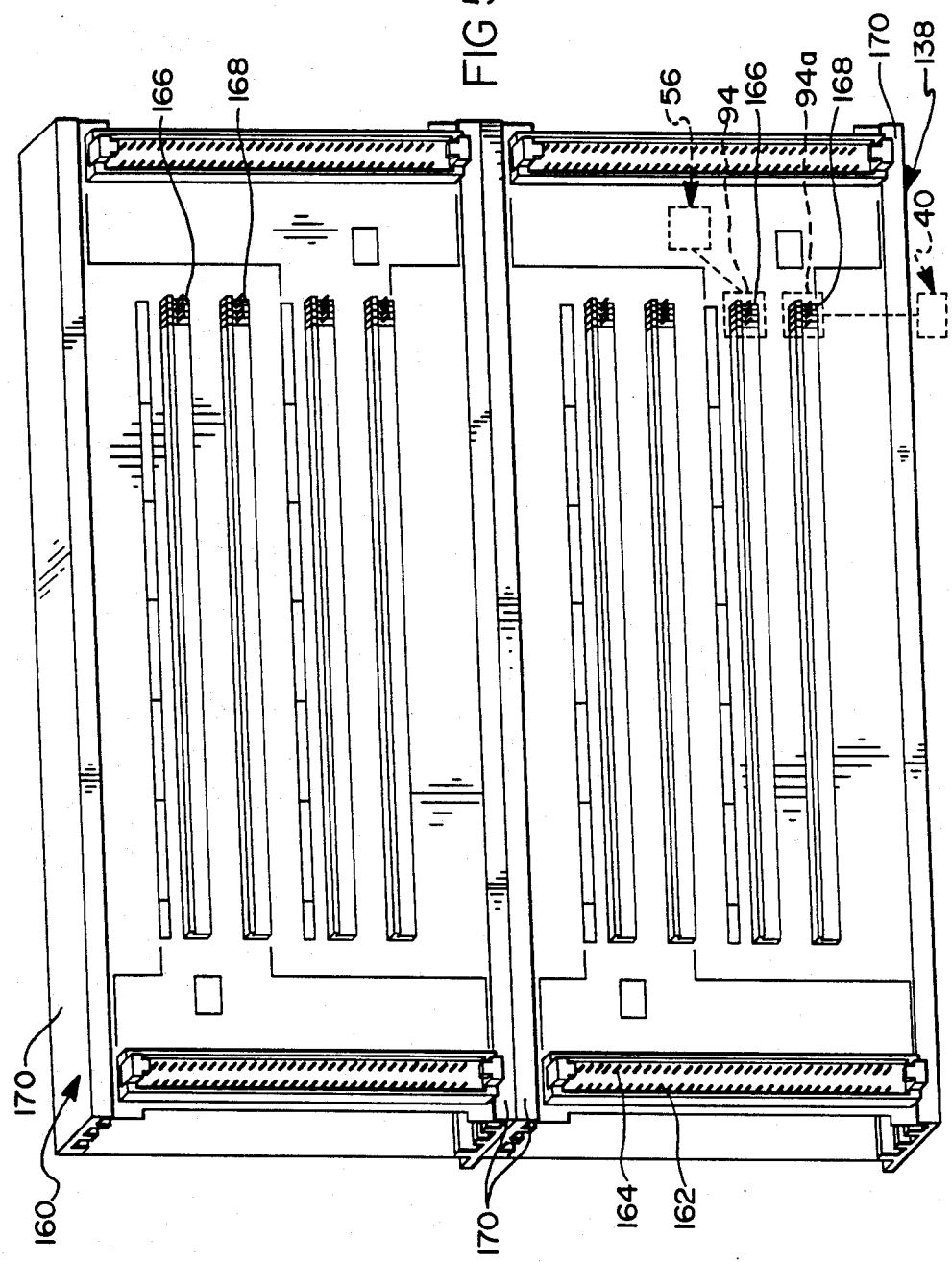

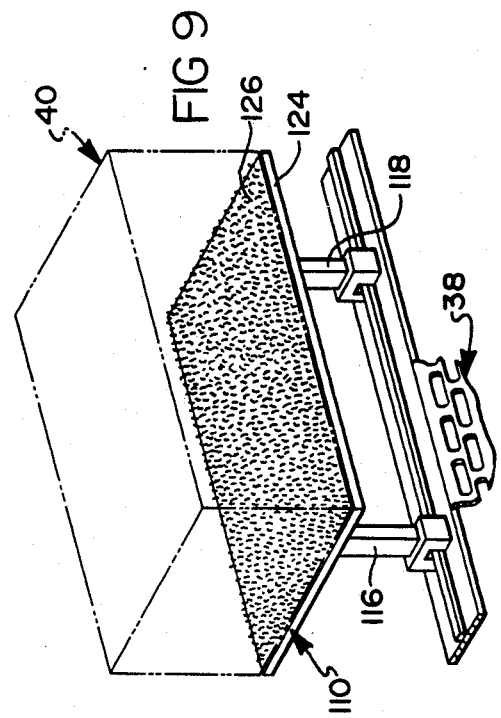
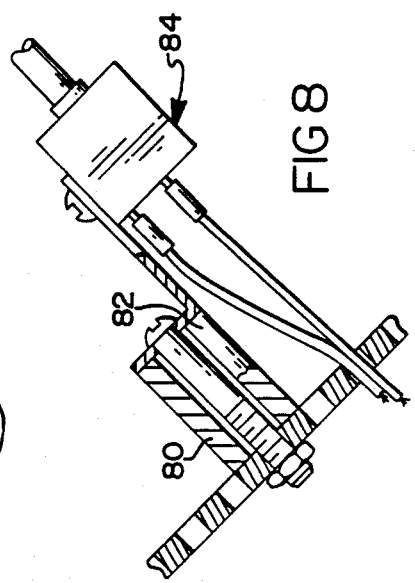
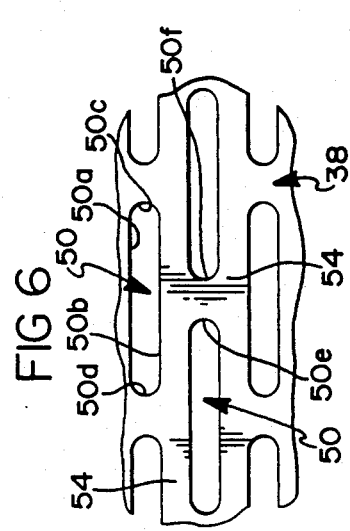
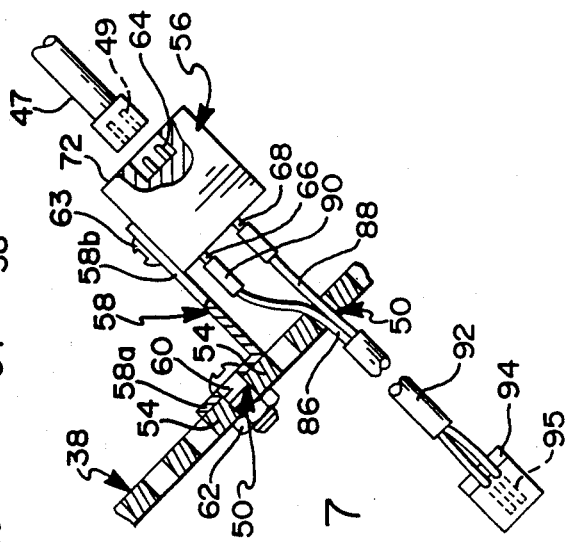

MODULAR TEST ASSEMBLY FOR WIRING HARNESSES

BACKGROUND OF THE INVENTION (1) Technical Field

The subject invention relates to test assemblies for evaluating the form, fit and function of preassembled wiring harnesses and more particularly to test stands including holders and detecting devices for testing completed wiring harnesses for open and shorted circuits and for the presence of clip and clamps on the harness for mounting it in a vehicular environment.

(2) Description of the Prior Art

It is known to provide a test stand for supporting a preassembled wiring harness for vehicular or other use so as to evaluate the form, fit and function of such preassembled harnesses. The need for such pretesting of modern day wiring harnesses is self-evident when considering the complexity of the electrical systems of automobiles and the like. In the past evaluation of such wiring harness has included use of a dedicated test stand having a solid plywood face on which connector holders and other presence detecting devices are mounted. Typically, such dedicated test stands have a single faceplate which is in the order of two feet high by four to ten feet long depending upon the length of the wiring harness being tested.

In such known test stands the single plywood face plate has specified holes cut therein to receive the holders and presence detecting devices which interface with the mounting brackets and terminals of a given preassembled harness design. Since each model of preassembled wiring harness has a different layout, each test stand is specially configured for one wiring harness. A large number of test stands of special design can require extensive storage facilities. Also, small changes in a design of a given wiring harness configuration can require extensive rework of the specially designed single plywood face plate.

Such rework can include cutting new holes and puttying or otherwise filling prior holes in the original faceplate layout. Changes can occur in wiring harness designs during the course of a model year. Such changes require that special test stands be taken off the plant floor and reworked at a separate location to accommodate running changes in the wiring harness design during the model year.

In specially designed test stand designs, the holders and presence detecting devices once mounted on such plywood faceplates are wired to either standard interface circuit boards or special test circuit boards located inside a test stand enclosure. Such holders and detection devices have discrete separate wires with crimped on sleeve terminals at each end which respectively connect each holder test pin with a single male pins on the interface circuit board. Such wires have variable lengths to accommodate the different special layouts on the faceplate and also require adhesive strip flags to label each end of wire to assure proper connection of the holder or detector device and the interface circuit board.

Such test stands have an electronic harness tester mounted on top of an enclosure. The enclosure has a single plywood faceplate with a length designed to accommodate the single wiring harness model to be tested thereon. The electronic harness tester is located at fixed connection points on such enclosures. It is mounted by drilling special holes in the bottom of the tester housing. Screws are directed through such holes to secure the tester housing on the top of the enclosure. Other mounting arrangements for the tester can include use of a mounting bracket system with arms which compress the tester housing between upper and lower clamp arms or alternatively the housing can be held in place on the enclosure by metal straps. In all cases, the harness tester housing is connected and disconnected by use of tools and held in a special relationship (fixed) with respect to interface circuit boards within the enclosure.

The wiring harness has test harness end connectors joined to test sockets in the holders. The holders are connected to either the standard interface circuit boards or to circuit boards specifically designed for each kind of special test sequence. The harness tester is operative to select and to record or indicate the tested function. A large number of different length wires run through a single compartment enclosure. A large single access door is on the rear of the enclosure. The door closes the complete length of the enclosure at its back. The door is held in place by elaborate latch and hinge elements. A ribbon cable for connecting the harness tester to the interface circuit boards passes between the top of the rear access door and the edge of the rear door at a pinch point.

The interface boards in prior test stands are connected to the harness tester by ribbon cables at a male pin, female connector matrix on the board. A 64 pin connector connects to the harness tester while the matrix of individual male pins is the point of connection for the specially designed array of discrete, individual holder and detector wires which run from each pin of holders on the faceplate to each male pin of interface circuit boards so as to serve as either electrical or presence "coupling" means in the assembly.

In order to special test wiring harness functions such as the resistance of the resistance wiring in the harness, relay testing, bulb burn and other special wiring harness functions, special circuit boards designed for such tests are provided. In the past, the special circuit boards and regular interface boards were mounted into a common extrusion. However, to interface such special boards with the harness end connectors has required splicing into the discrete wires from the standard interface boards to the test holders.

Other stand type systems include U.S. Pat. No. 3,653,411 which discloses a single compartment enclosure having a front face onto which wiring components are joined to form an assembly. The faceplate constitutes a pegboard into which nails are pressed to define routing for wire. There is no suggestion of a system for solving the problem of how to quickly change the holder positions in a test system for checking electrical functions and mounting features of a wiring harness which is preassembled at one point and then moved to the test stand where terminals on the wiring harness are connected to holders on the test stand. Further the '411 patent does not disclose a modular type test stand which can be shortened or lengthened to support different sized wiring harness which can be joined by cables of a fixed standard length(s) to operatively connect circuit board and harness tester units of a system for functionally testing the operation of such preassembled varieties of wiring harness.

U.S. Pat. No. 3,705,374 (Tuller) discloses a support box on which wire components are assembled. The system includes a light indicator sequenced to instruct an assembler which wire to pick from a component supply during the course of the wiring assembly. Special connectors interface the light indicator and the faceplate of the assembly stand. As in the case of the aforementioned '411 patent, the Tuller proposal requires that each assembly setup have a fixed location for the connectors thereon. If a new harness is placed on the front face the faceplate must be reworked by drilling new holes and filling of old holes. There is no suggestion of use of modular standard length test stand components which can be aligned to accommodate different length, preassembled wiring harnesses or which can be configured to enable holders to be connected to interface boards by the use of standard length cables.

U.S. Pat. No. 4,183,091 discloses a wiring board for assembling wire components from a storage case. The board includes a plurality of LED lamps which are wired through the board to indicate proper routing of the wire components during an assembly process wherein the wire components are routed by guide pins. U.S. Pat. No. 4,483,373 discloses still another version of a wire assembly stand. The '091 and '373 patents do not disclose an arrangement for mounting holder components on a faceplate in a manner which will enable them to be fastened to conform to a first preassembled wiring harness configuration and which will further enable the holders to be readily repositioned to accommodate a variant of the wiring harness configuration. There is no provision to electrically test a preassembled harness and there are no modular units located end to end to accept different length wiring harness designs while enabling the interface boards and harness testers to be connected by standard length cables. Further, there are no holders which have a test socket on one end adapted to mate with an end connector on a wiring harness and wherein the test socket is prewired to a standard length cable having an end connector which fits through faceplate slots for access to mating connector pins on an interface circuit board.

While the prior art discussed above accomplishes the purposes set-forth therein, they are unable to meet the need for quick turn around of a wiring harness test stand for testing the form, fit and function of wiring harnesses for use on a wide range of vehicle types and especially for quick turn around of a specific wiring harness design which is slightly modified during the course of a model year change.

SUMMARY OF THE INVENTION AND ADVANTAGES

The wiring harness test stand of the present invention includes a plurality of modular frame units that are open ended to be connected together to define expandable length stands capable of accepting a wide range of wiring harness types without requiring rework of the test stand off-site of its use location.

One feature of the present invention is the provision of a faceplate which is fully slotted across the planar extent thereof. The slot configuration is shaped to accommodate holders, detection devices and fasteners on modular units placed end to end to conform to a particular wiring harness design. The fully slotted faceplate provides quick on-site adjustment to accommodate a wide range of different length wiring harnesses suited for use in a wide range of vehicle models both as to size, shape and wiring harness function. The slots are sized to provide access for a multiple point connector plug on the end of a cable prewired to holders or detectors mounted on the outer surface of the faceplate.

Yet another feature of the present invention is to provide modular units and fully slotted faceplates as set forth in the preceding paragraph and wherein a set of interface circuit boards located interiorly of the modular units and a harness tester located exteriorly thereof are joined by standard length cables having one end prewired to holders and detection devices mounted at the faceplate slots and having the opposite end wired to a connector or plug which fits through a single slot to provide multiple connections at the interface circuit boards.

Still another feature of the present invention is to provide a harness tester support array located exteriorly of the modular units on standardized support platform which include means for releasably connecting the housing of the harness tester on the support platform without use of tools.

Other features of the present invention include use of a tester interface board providing parallel connections for the testing of devices such as light bulbs and relays and/or confirming the values of such devices such as diodes, capacitors, resistors contained in a wiring assembly without splicing into wiring from the test holders to interface circuit boards.

The present invention, in particular, requires no off-site reworking in order to adapt the operating components thereof to functional and structural changes in a wiring harness because of changes thereof within a model year. The present invention additionally solves the problem of off-site rebuilding of wiring harness test stand configurations in order to change from one type of wiring harness to another because of different model run requirements of the vehicle assembler.

BRIEF DESCRIPTION OF THE PRESENT INVENTION

Other advantages, features and capabilities of the present invention will be readily appreciated as the same becomes better understood by reference to the following detailed description when considered in connection with the accompanying drawing wherein:

FIG. 2 is an enlarged perspective view of the front of another embodiment of a wiring harness test stand with three modular units;

FIG. 3 is an enlarged perspective view of the rear of the FIG. 2 embodiment;

FIG. 5 is a perspective view of interface cards mounted on stackable extrusions of the present invention;

FIG. 6 is an enlarged fragmentary view of a segment of a slotted faceplate of the present invention;

FIG. 7 is an enlarged sectional view taken along line 7—7 of FIG. 1 looking in the direction of the arrows;

FIG. 8 is a fragmentary sectional view of another holder configuration; and

FIG. 9 is a fragmentary view of a releasable support system for a harness tester in the embodiments of either FIG. 1 or FIG. 2.

DESCRIPTION OF THE PREFERRED EMBODIMENT

Figure 1:
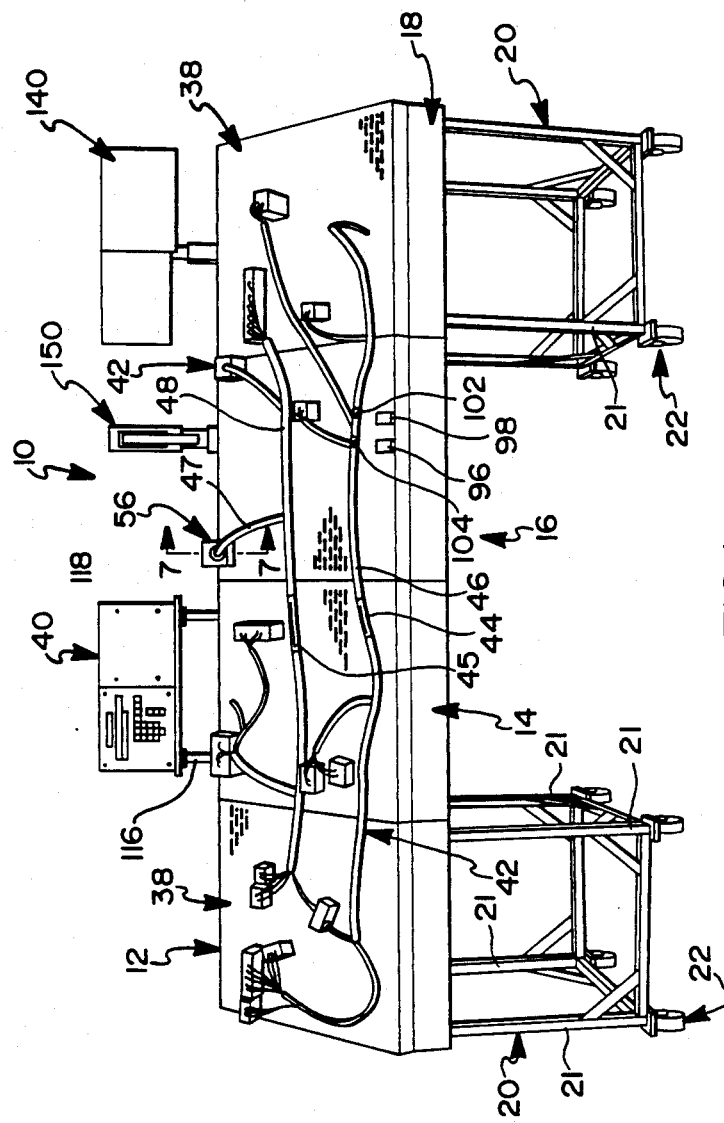
FIG. 1 is a perspective view of a wiring harness test stand having a preassembled wiring harness mounted thereon for testing by a exteriorly mounted harness tester unit.

Referring to FIG. 1, a wiring harness test stand 10 is shown comprised of four modular units 12, 14, 16 and 18. The outboard units 12, 14 include a support frame 20 having vertical corner legs 21 each having a caster 22 connected thereto so as to support the test stand 10 for movement to different testing locations.

Figures 4, 4A:
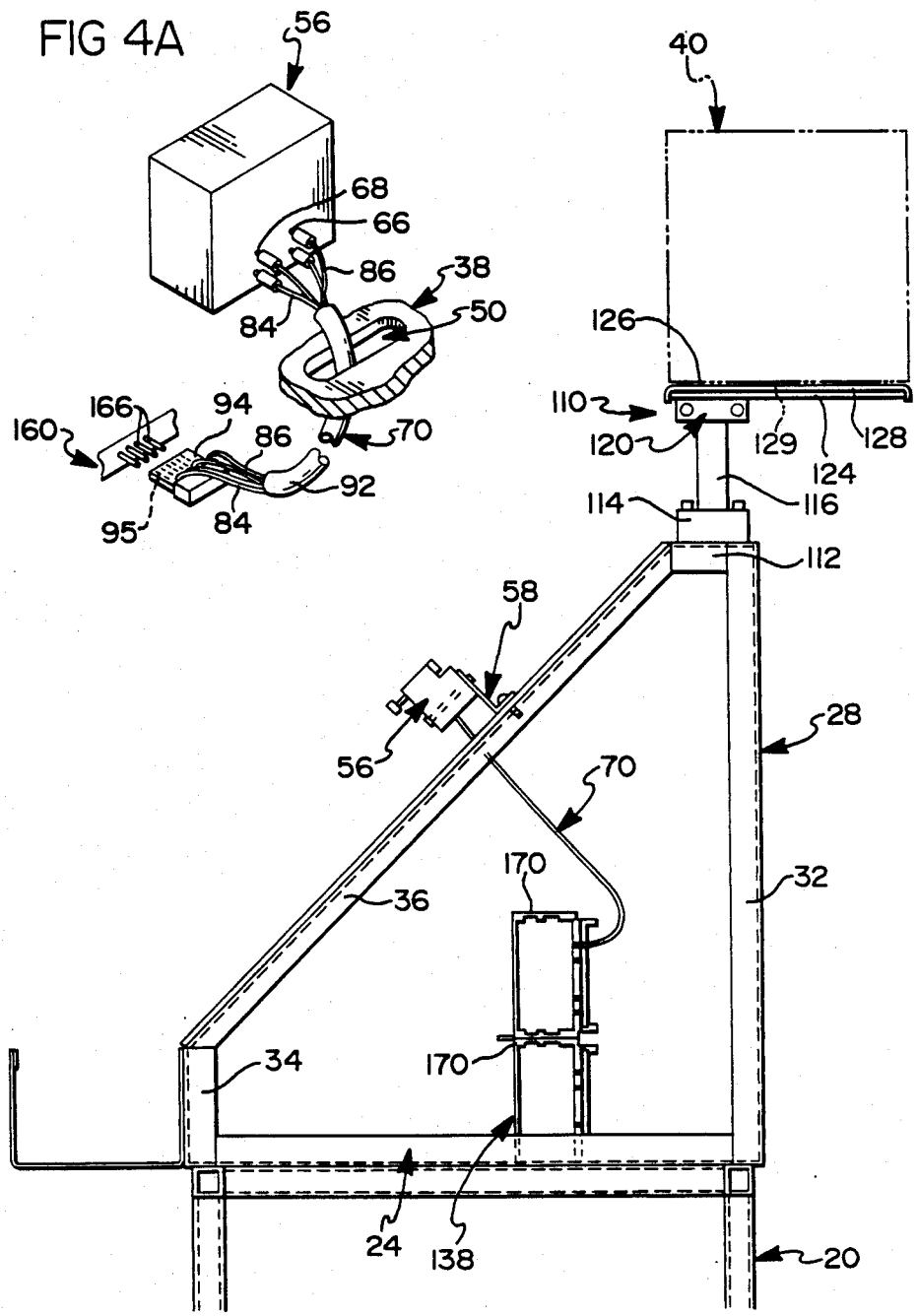
FIG. 4 is side elevational view of a modular unit.
FIG. 4A is an exploded, perspective view of a standard length cable assembly with associated components of the present invention.

In the embodiment of FIGS. 2-4, the adaptability of the invention to different length wiring harnesses is demonstrated. In this embodiment the modular unit 14 is omitted to shorten the test stand 10 for shorter wiring harness configurations.

Each module 12-18 includes a welded angle iron frame having a base frame 24 (FIG. 3) which supports a floor plate 26. Each of a pair of end frames 28, 30 have a rear upright 32; a front upright 34 and an angle 36 connected between the upper ends of each of the rear and front uprights 32, 34 for supportingly receiving a faceplate 38 to locate it in an inclined plane for ease of supporting a preassembled wiring harness thereon for coupling thereof to holder and position detector devices in preparation for conducting a known wiring harness test sequence by means of a harness tester 40 located immediately above the faceplate 38 in a manner to be discussed. The outboard ends of the end modules 12 and 18 have interchangeable end plates (unnumbered) as shown in FIGS. 2 and 3.

A representatively illustrated preassembled wiring harness 42 is shown mounted on the faceplates 38 of the test stand 10 of FIG. 1. It has electrically insulated resistance wire segments 44, 45 covered by protective cladding 46, 48. Several unnumbered branches are also shown in the wiring harness 42. The test segment 47 has an end connector 49 thereon adapted to be connected to the test stand 10 wiring as will be discussed. The end connector 49 is representative of end connectors on the other illustrated branches. The illustrated preassembled wiring harness 38 is representative of the complex form and fit of wiring harness which must be tested for functional operation and fit prior to assembly within the confines of an installation such as the compartments of a vehicle. While the test stand 10 is suited for use with vehicle wiring harnesses, it is equally suited for use in testing a wide range of other preassembled wiring systems/harnesses.

In order to assure proper operation of the wiring harness 42 after installation in a vehicle, it is necessary to pretest the resistance of the resistance wire in the wiring harness; and to pretest relays, bulb burn or lighting, heater, radio, airconditioning and drive motor components to list a few functions. Such variety of functional tests are required to evaluate the continuity and integrity not only of the resistance wire segments of the wiring harness but also to check the continuity and integrity of each of a number of electrical terminals wired to the various branches thereof.

Use of modules 12-18 does not require an accurate pre-estimate of the length of the enclosure required for the harness changes. The modular units are easily joined by increments of two feet as represented by the length of each of the frames 24. A removable stand 20 can be placed under any of the modules at the frames 24 thereof to quickly accommodate different length wiring harnesses at onsite testing locations.

In accordance with one feature of the present invention the faceplate 38 is slotted across the full planar extent thereof. More particularly, slots 50 are formed in ranks which alternately overlap as best seen in the fragmentary segment of the faceplate 38 shown in FIG. 6.

As seen in FIG. 6, the slots 50 in one rank have spaced sidewalls 50a and 50b and rounded ends 50c, 50d. The slots 50 in the next lower rank have the same length and width and have rounded ends 50e and 50f located approximately midway of the length of the slots 50 in the higher row. The above described and illustrated pattern is repeated in succeedingly lower ranks of slots shown in outline in FIGS. 1 and 2. Partial slots 52 are provided at the outer side margins of the faceplates 38.

The sidewalls 50a, 50b are located in spaced parallelism and have a spacing distance which is adapted to receive standard fasteners for securing holders and detection devices on the outer surface of the faceplates 38 where they can be quickly connected and disconnected during the series testing of wiring harnesses preassembled at another location.

In order to accommodate standard holders and standard cables, the slots 50 in one representative working embodiment have slots 50 that are two inches long from tangent lines at either end of the slots 50. Each slot 50 has a width of 0.31 inches and the short slots 52 have a width of 0.31 inches and a length of 0.83 inches. The slots 50 have lands 54 formed therebetween of a width which will support the holders and which receive screws/nuts or other fasteners for securing the holders in place on the faceplates 38. In the working embodiment the lands extend the full length of the faceplate 38 and have a width which is substantially equal to the width of each of the slots 50. The side margin of each faceplate 38 is 0.50 inches from the rounded ends of the outside ones of the slots 50 and the top and bottom margins are 1.22 inches from the upper and lower edges of the faceplate 38 and the upper and lower rank of slots respectively.

One advantage of such a slot pattern is that holders and detection devices can be mounted in a variety of attitudes and still accommodate both fasteners, holder brackets and wiring on prewired holders without drilling special holes or without splicing holder wires to get a special fit for harness modifications.

Thus, as seen in FIG. 1, holders 54, 56 can be located at angles with respect to the slots and the holders will be arranged to be easily and quickly secured thereon without special preparation or modification.

FIG. 7 shows a blowup of the holder 56. A bracket 58 has one leg 58a supported on lands 54 by means of a standard fastener such as a screw 60 which extends through a slot 50 between the lands 54 where it is secured in place by a nut 62. Leg 58b of the bracket 58 is secured to the holder 56 by screws 63.

By virtue of the aforedescribed faceplate 38 and the slots 50 therein, fasteners such as screw 60 and nut 62 can be slightly loosened and the holder or presence detecting device 56 can be shifted laterally in the slots 50 to accommodate and slightly adjust for the changes in the build tolerances of preassembled wiring harnesses with many connection points located at a widely spaced number of points on the faceplate 38.

The holder 56 more particularly includes a test socket 64 adapted to be connected to the end connector 49 of the wiring harness test segment 47. The test socket 64 is electrically connected to test pins 66, 68 on the opposite end of the holder 56. The pins 66, 68 are prewired to one end of a standard length cable assembly 70. The arrangement enables the test harness segment 47 to be easily secured to the holder 56 at its upper end 72 without stressing wire segments. Thereafter, the fastening nut 62 is tightened. Access to nut 62 is obtained by pivoting the faceplate 38 forwardly of the frames 24 at a hinge 74 which connects the lower edge 76 of the faceplate 38 to a front angle 78 of the frame 24.

Since the holder's position can be easily changed and adjusted, the starting layout of the various operative holders, detection devices and the like can be easily changed both to accommodate different model preassembled wiring harnesses and to accommodate changes made during a model run to a series run of the same kind of preassembled wiring harness. Also, the provision of full surface slotting enables the same faceplate 38 to be used without requiring filling, redrilling or reshaping of hole configurations in the faceplate 38 during the changeover process.

The illustrated holder 56 of FIG. 7 shows a bracket configuration suitable for use with small holder housing in which the illustrated single right angle bracket is suitable to secure the holder housing in place. Like brackets are attached to each sized holder by use of standard fasteners. Some holders have "presence detectors" that detect the presence of seals, clips, and other nonelectrical conducting items assembled to the connector. These "presence detecting" holders extend deeper than holders without "presence detectors" and require mounting further off the slotted faceplate. A pair of tubular stands 80, 82 space the detector 84 out from the slotted faceplate. The tubular stands 80, 82 mount between leg 58a of the standard bracket attached to the holder housing and the slotted faceplate.

In accordance with a feature of the present invention, each of the test pins 66, 68 on holder 56 is prewired to conductors at solder connections 86, 88. The solder connections are strain relieved by use of heat shrinkable tubing 90 placed over the solder joint. The conduits 86, 88 are part of a standard length cable 92 (four feet in one embodiment) to allow a holder 56 to be located anywhere on a two foot square faceplate 38 and reach to be plugged into tester interface cards 160 located interiorly of the modules 12–18.

Another feature of the invention provides a multiple connector plug 94 on one end of the standard length cable 92. The plug 94 is sized to fit through one of the slots 50. The slots 50 thereby provide access to snake the standard length cable 92 through the faceplate 58 to be connected to predetermined ones of each of two horizontal rows of pins on the interface board to be described at pin holes 95 in the plug 94.

The standard length cables 92 can be 2, 4, or 8 conductor, non-ribbon jacketed cable. Multiple groupings of such conductors are combined depending upon the holder type being prewired. For example, a holder with 10 circuit test pins combine a 2 conductor cable with a 8 conductor cable for a total of 10 leads. A 11 pin holder would use a combination of a 4 conductor cable and a 8 conductor cable with one conductor being unused. In all cases however only three types of standard length cables, e.g., 2, 4 and 8 conductor cables of four feet length are used to wire a test stand for whatever preassembled wiring harness is to be mounted for connection thereon for testing its form, fit and function.

When reference is made to form and fit it should be understood that the wiring harness can include preassembled brackets and other devices for locating the tested unit in a vehicle environment or other environment requiring complex wiring systems connected to various energizeable elements. The testing process therefor includes presence detecting devices such as sensors 96, 98 (FIG. 1) which respectively illustrate devices which detect the presence of harness brackets 100, 102 for holding one segment of the wiring harness on a vehicle.

Still another feature of the present invention is that the electronic harness tester 40 is mounted on top of a standardized test mounting platform 110 which is adapted to be located at one of several positions along the length of the connected modules 12–18. In FIG. 2 the frame angle 112 at the top of each of the modules 12–18 has brackets 114 which are connected by suitable fasteners at spaced drill holes in the angle 112. The brackets 114 secure two spaced columns 116, 118 on the angle 112 and the opposite end of each of the columns 116, 118 are fastened by means including clamps 120, 122 to a plate 124 which is cantilevered rearwardly of module 14. As best seen in FIGS. 4 and 9, the plate 124 carries strips of hook tape 126 which are releasably connectable to strips of loop tape 128 connected to the bottom 129 of the harness tester 40.

The mounting platform allows a harness tester 40 to be to be easily mounted on the joined modules so as to allow ribbon cables 130 thereon to be passed through corner cutouts 132 in a backplate 134 on each of the modules 12–18. The backplates 134 are connected to the frame 24 by a hinge 136 so as to be swung fully open to provide access to a mounting extrusion 138 connected to the floor 26 for receiving the various selected interface cards used in testing a given wiring harness design.

Also the hook and loop type mounting platform 110 also allows for quick removal and replacement of a malfunctioning harness tester during on-site assembly plant testing of the harness thereby to reduce manufacturing down time. The mounting platform 110 is configured to be located at 8 inch increments along the length of the joined modules. Such standardized positioning is established by standardized holes in the angle 112. Further, the arrangement described above enables the harness tester 40 to be located at the best viewing angle suited for the operator position for a given preassembled wiring harness design.

The position of the harness tester is also easily adjusted to accommodate other operating accessories in the standardized holes in the angle 112 such as holders for visual aids 140 which indicate to the operator the testing sequence and tape holders 150.

The extrusion 138 (FIG. 3) has interface boards thereon like interface board 160 in FIG. 5. Each interface board 160 includes a pair of vertical male pin female connectors including two rows 162, 164 of 32 pins totalling 64 and each of which connects to a pair of corresponding horizontal rows 166, 168 of pins into which the holders 46 or detectors 84 are joined by the connector plugs 94 on the ends of the standard length cables 92 at pin holes 95 in the connector plugs 94 (as shown in Fig. 4A).

Standard length 10 inch extrusions 170 are used to hold the interface cards or boards in place within the modules. The same standard spaced mounting holes are drilled in the top and bottom of the extrusions 170 and in the floor 26 of each module 12–18. This enables the extrusions 170 to be stacked on top of one another as illustrated. In the working embodiment 30 inches of such boards can be accommodated in each module 12-18. The cutout 132 in each backplate 134 has its edge covered by a protective cover 172 to provide a path which will not pinch or cut the cables which interface the harness tester 40 with the interface boards.

The holder to test interface board arrangement also provides for parallel connections. Typically, the connector plugs 94 are plugged to the upper row 168 and any electrically parallel connections such as those required for special tests are provided by connector plugs 94a connected to the bottom row 166. The plugs 94a are electrically connected to the harness testers. Such electrically parallel connection points, on one interface board, allow the special test wiring to be connected in to the wiring harness 42 without splicing into the holder wiring. This preserves the integrity of the holder wiring which is designed to be reused numerous times as a holder is required on various test assemblies over the usable life of the holder. Additionally, during troubleshooting of the operation of the complete testing assembly wiring, the special testing boards can be easily unplugged to confirm the correct holder wiring.

The aforedescribed test stand while suited in particular for use which automotive type applications is equally suitable for use in testing any preassembled wiring harness system which once installed can only be replaced or repaired by considerable cost and effort because of the necessity of shielding the various runs and for connecting them at a wide number of difficult to access points in the vehicle structure. The aforedescribed system is unusually suited for quick change to meet a wide range of test requirements. In all cases however, it retains a high order and robust integrity of the connections between the tested object and the operative components of the testing system.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims the invention may be practiced otherwise than as specifically described.

What is claimed is:

1. In a test assembly for checking the operative characteristics, presence of harness mounting features and electrical terminals for coupling a preassembled wiring harness in operative position in an environment by use of interface circuit boards and a harness tester for selectively connecting individual ones of the circuit boards to the preassembled wiring harness in accordance with a desired testing sequence the improvement comprising:
   a plurality of modular units including frame means adapted to be jointed end to end to accommodate different length preassembled wiring harnesses of varying form, fit and function;
   each of said modular units including a faceplate with an inner and outer surface and having slot means therein extending across the full planar extent of the outer surface thereof;
   a plurality of standardized brackets;
   said slot means comprising a plurality of elongated slots which are formed in ranks which alternately overlap to provide openings for mounting and locating said standardized brackets in a spaced array corresponding to the form, fit and function of a preassembled wiring harness;
   fastener means cooperating with said slot means for adjustably securing said brackets with respect to each of said faceplates so as to permit spatial adjustment thereof with respect to a preselected preassembled wiring harness; and
   coupling means on said brackets for providing either an electrical connection to a wiring harness or for detecting the presence of mounting means thereon when the wiring harness is in a desired attitude corresponding to the assembled position of the wiring harness.

2. In the test assembly of claim 1, an interface board, a standard length cable for each of said coupling means having opposite ends, one end of each said cable being prewired to one of said coupling means, and connector plug means on the opposite end of each said cable insertable through said slot means for electrically connecting said one coupling means to said interface board from any point on said faceplate.

3. In the test assembly of claim 1, said modular units each having a frame means with top, bottom and side brackets defining open ends, an inclined front opening and a rear opening;
   said faceplate covering said inclined front opening and means for hinging said faceplate to said frame means to provide access to the interior of said frame means from in front of said frame means and for providing access to said fastener means for tightening said brackets on said faceplate following adjustment thereof with respect to said faceplate.

4. In the test assembly of claim 3, means inside said frame means for fixedly supporting interface boards with respect to said frame means for electrical connection by standard length cable to both said coupling means and a harness tester.

5. In the test assembly of claim 3, the plurality of modular units including modular units at each end which have frame means defining open ends at their respective outboard ends and interchangeable end plates for covering the outboard open ends.

6. In the test assembly of claim 3, an interface board located interiorly of said frame means, said coupling means including prewired housings and a connector plug means passed through one of said slot means when said brackets are secured to said faceplate to extend inboard thereof to a point of connection on said interface board.

7. In the test assembly of claim 6, a harness tester located exteriorly of said frame means, said frame means having a standardized fixed location interiorly thereof for mounting said interface boards for connection by said connector plug means to both said coupling means and said harness tester.

8. In the test assembly of claim 1, means providing parallel electrical connections between the interface boards, said coupling means and the harness tester unit.

9. In the test assembly of claim 2, means providing parallel electrical connections between the interface boards, said coupling means and the harness tester unit.

* * * * *